United States Patent [19]

Ishikawa et al.

[11] Patent Number: 5,123,163

[45] Date of Patent: Jun. 23, 1992

[54] PROCESS AND APPARATUS FOR FORMING BUMPS ON FILM CARRIER

[75] Inventors: Michio Ishikawa; Toshio Ohkubo; Yasuhiro Otsuka, all of Tokyo, Japan

[73] Assignee: NEC Corporation, Tokyo, Japan

[21] Appl. No.: 510,208

[22] Filed: Apr. 17, 1990

[30] Foreign Application Priority Data

| Apr. 27, 1989 | [JP] | Japan | 1-111538 |
| Dec. 26, 1989 | [JP] | Japan | 1-337591 |
| Jan. 17, 1990 | [JP] | Japan | 2-7635 |
| Jan. 19, 1990 | [JP] | Japan | 2-10256 |
| Feb. 28, 1990 | [JP] | Japan | 2-49911 |

[51] Int. Cl.⁵ ..................... H01R 43/00; B21B 15/00
[52] U.S. Cl. ..................... 29/827; 29/33 M; 29/718; 174/52.4; 357/70; 357/80
[58] Field of Search ............ 357/70, 80; 174/52.4; 29/882, 33 M, 718, 827

[56] References Cited

U.S. PATENT DOCUMENTS 4,396,457  8/1983  Bakermans ............... 357/70 X

*Primary Examiner*—Carl J. Arbes
*Attorney, Agent, or Firm*—Laff, Whitesel, Conte & Saret

[57] ABSTRACT

A film carrier is used for fabricating a semiconductor device, and comprises an insulating film and a plurality of conductive leads each extending on the insulating film and having a front side surface and a reverse side surface, and a bump is formed in each of the conductive leads and has a projecting surface projecting from the reverse side surface and a depressed surface defining a recess open to the front side surface, so that the bump has a dome-shaped configuration and is much liable to deform in a thermocompression bonding stage.

2 Claims, 19 Drawing Sheets

PROCESS AND APPARATUS FOR FORMING BUMPS ON FILM CARRIER

FIELD OF THE INVENTION

This invention relates to a tape automated bonding technology used in a fabrication of a semiconductor device and, more particularly, to a film carrier having conductive leads with bumps respectively bonded to pads of a semiconductor chip.

DESCRIPTION OF THE RELATED ARTS

The automated bonding technology is widely used in fabrication of semiconductor device, and bumps are formed on either surfaces of conductive leads of a film carrier or pads of a semiconductor chip. The former technology is, by way of example, described by Davis et al. in "Solid Logic Technology: Versatile, High-Performance Microelectronics", IBM JOURNAL, April 1964, pages 102 to 114. According to the paper, bumps are directly formed on pads of a semiconductor chip through a plating process. The bumps formed on the pads are further disclosed by Kenzo HATADA in "Stacked IC Technology by Transferred Bump Method", the second article of National Convention of semiconductor-and-material division of showa-60 (1985) Electro-Communication Society, November 1985. Hatada proposes to pattern bump array on a glass substrate which are transferred to pads of a semiconductor chip. However, those techniques require the manufacturer to prepare expensive plating and lithographic systems, respectively, and consume a plenty of time and labor, thereby increasing the production cost of the semi-conductor devices. Moreover, since semiconductor chips are dipped into a solution while plating or are subjected to thermocompression, the semiconductor chips are liable to be damaged, and, therefore, suffers from a low production yield. Thus, the bumps directly formed on the pads are not desirable in view of cost and production yield.

On the other hand, the later technology is free from the drawbacks inherent in the former technology. One of the bump formation techniques is disclosed in Electronic Packing & Production, December 1984, pages 33 to 39, and the bumps are formed on inner leads of a film carrier through a pedestal process using an etching technique. Namely, the bump forming areas of the inner leads are previously masked with a resistive material, and the exposed areas of the inner leads are partially etched away. Then, the inner leads have the half-etched portion relatively small in thickness and the bump portions relatively large in thickness. Each of the bumps is as high as 30 to 40 microns, and the inner leads are required to be as thick as the bumps prior to the etching stage. However, the inner leads of about 30 to 40 micron thick are twice as thick as ordinary inner leads, and is, therefore, wasteful in view of material cost. Moreover, the etching stage requires the manufacturer to prepare an expensive lithography system, and this results in increasing the production cost of the semiconductor devices.

Another bump formed on the film carrier side is disclosed by Kenzo HATADA et al. in "New Film Carrier Assembly Technology: Transferred Bump Assembly Technique", a hundred and seventieth article of National Convention of semiconductor-and-material division of showa-58 (1983) Electro-Communication Society, September 1983. According to the article, bumps patterned on a glass substrate are transferred to the leading end portions of inner leads through a thermocompression stage. However, the bump transferring technique proposed by HATADA consumes a plenty of time and labor because the bumps are previously patterned on the glass substrate and, then, transferred to the leading end portions of the inner leads.

For providing a solution of the drawbacks inherent in those techniques, Japanese Patent Publication (Kokoku) No. 64-10094 discloses a process of forming inner leads with pedestals. The process disclosed therein utilizes a press machine equipped with a mold consisting of a female die 1A and a male die 1B as shown in FIG. 1 of the drawings. The female die 1A is stationary and fixed to the press machine, but the male die 1B is upwardly and downwardly movable with respect to the female die 1A. The female die 1A is formed with a recess where a resin film 2A of a film carrier 2 is received. The film carrier 2 further has inner leads 2B which extend on the top surface of the female die 1A, and notches 2C are formed on both sides of each inner lead 2B. The male die 1B has a guide projection 1C movable into or out of a center recess 1D and punching portions 1E, and the punching portions 1E are larger in width than the inner leads 2B. When the male die 1B moves into the female die 1A, the punching portions 1E deform the leading end portions of the inner leads 2B, respectively, and small recesses 2D are respectively formed therein. Then, bumps 2E are produced at the leading end portions of the inner leads 2B. Upon the formation of the small recesses 2D, swarf takes place, but is thrown through the notches 2C.

The formation technique disclosed in Japanese Patent Publication No. 64-10094 is free from the above described techniques utilizing either plating or lithographic process, because the bumps 2E are produced through the machine work. However, a problem is encountered in the film carrier 2 in that some of the bumps 2E are not secured to pads of a semiconductor chip through a thermocompression bonding process. This is because of the fact that the bumps 2E are substantially rigid against the compression and any irregularity in height thereof is hardly taken up. The electrical disconnections are causative of inferior products, and, therefore, deteriorates the production yield of the semiconductor device. If the irregularity in height is fallen within a range under 0.5 micron, the electrical disconnection does not take place; however, such a high finish is costly and increases the production cost of the semiconductor device.

In addition, the notches 2C are indispensable for the inner leads 2B, and the formation of the notches 2C consumes a plenty of time and labor which increases the production cost of the semiconductor device.

SUMMARY OF THE INVENTION

It is therefore an important object of the present invention to provide a film carrier which is inexpensive and free from any electrical disconnection to a semiconductor chip.

It is also an important object of the present invention to provide a process through which a bump is formed on a conductive lead without any high precision finish.

It is still another important object of the present invention to provide an apparatus which is utilized in the process for forming a bump on a conductive lead.

To accomplish these objects, the present invention proposes to form a hollow or dome-shaped bump on a conductive lead of a film carrier.

In accordance with one aspect of the present invention, there is provided a film carrier used for fabricating a semiconductor device, comprising a) an insulating film, and b) a plurality of conductive leads each extending on a surface of the insulating film and having a front side surface and a reverse side surface, in which a bump is formed in each of the conductive leads and in which the bump has a projecting surface projecting from the reverse side surface and a depressed surface defining a recess open to the front side surface.

In accordance with another aspect of the present invention there is provided a process of forming a bump in a conductive lead of a film carrier, comprising the steps of: a) preparing the film carrier, a pressing machine and a drawing die unit having a female die and a male die, the drawing die unit being installed in the pressing machine, the female die having a recess smaller in width than the conductive lead, the male die having a protrusion movable into the recess formed in the female die, b) placing the film carrier on the female die in such a manner that the conductive lead covers the recess formed in the female die, c) aligning the male die with the female die in such a manner that the protrusion is movable into the recess, and d) causing the pressing machine to press one of the female and male dies toward the other of the female and male dies so that the conductive lead is deformed to have a bump having a projecting surface projecting from a reverse side surface of the conductive lead and a depressed surface defining a recess open to a front side surface of the conductive lead.

In accordance with still another aspect of the present invention, there is provided a drawing apparatus for forming a bump in a conductive lead of a film carrier, comprising a) a frame, b) a female die stationary with respect to the frame and having a recess which is covered with the conductive lead of the film carrier, c) a male die movable with respect to the frame and having a protrusion movable into the recess formed in the female die, and d) a driving mechanism causing the male die to move toward the female die and allowing the protrusion to deform the conductive lead for forming a bump having a projecting surface projecting from a reverse side surface of the conductive lead and a depressed surface defining a recess open to a front side surface of the conductive lead.

BRIEF DESCRIPTION OF THE DRAWINGS

The features and advantages of a film carrier, a process of forming a bump and an apparatus for forming a bump according to the present invention will be more clearly understood from the following description taken in conjunction with the accompanying drawings in which.

DESCRIPTION OF THE PREFERRED EMBODIMENTS

First Embodiment

Structure of Film Carrier

Figure 1:
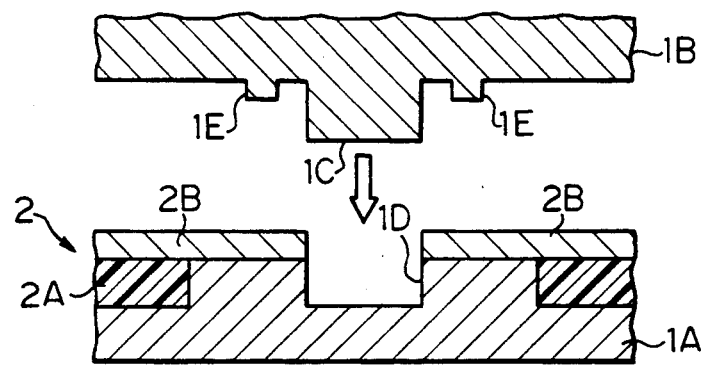
FIG. 1 is a cross sectional view showing a mold utilized in the prior art formation process.
Figure 2:
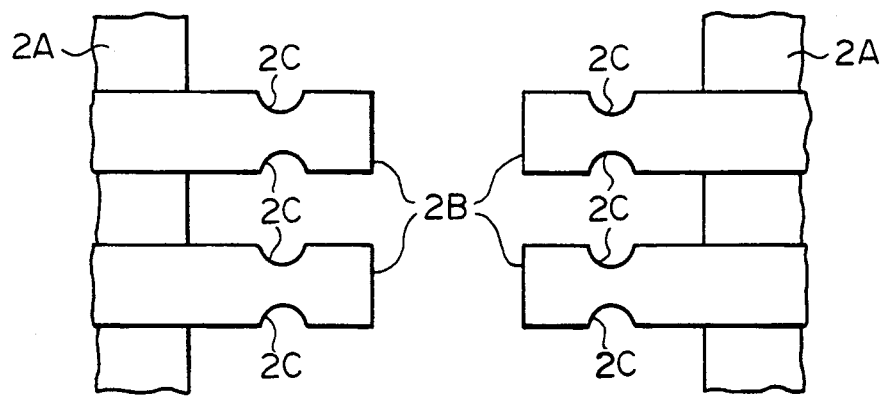
FIG. 2 is a plan view showing a part of a prior art film carrier formed through the prior art process.
Figure 3:
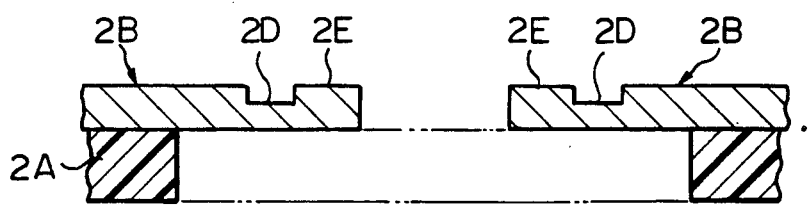
FIG. 3 is a cross sectional view showing the film carrier shown in FIG. 2.
Figure 4:
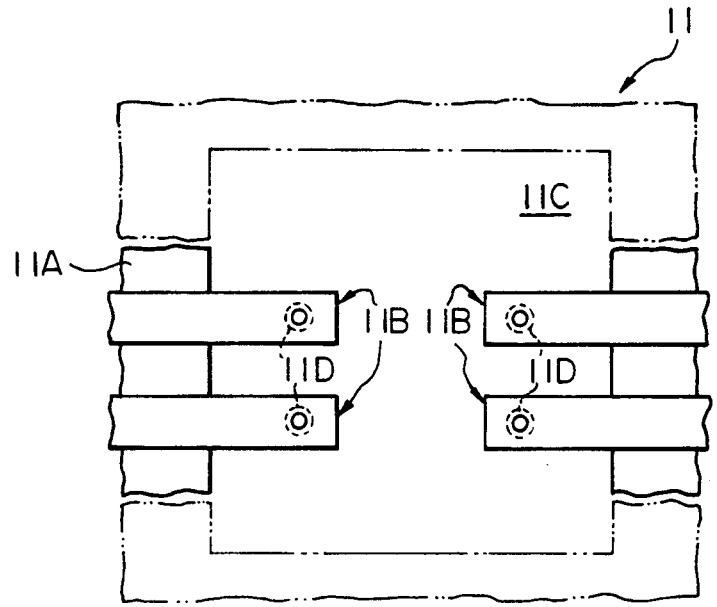
FIG. 4 is a plan view showing a part of a film carrier according to the present invention.
Figure 5:
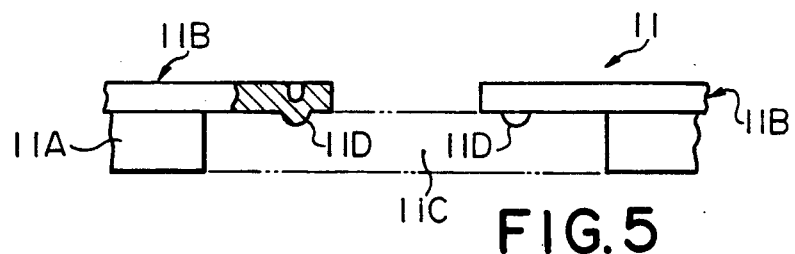
FIG. 5 is a partially cut-away side view showing the film carrier shown in FIG. 4.

Referring first to FIGS. 4 and 5 of the drawings, a film carrier 11 embodying the present invention largely comprises an insulating resin film member 11A and a plurality of conductive inner leads 11B. Although a large number of the conductive inner leads 11B are provided on the insulating resin film member 11A, only two conductive inner leads 11B are shown in FIG. 4. The conductive inner leads 11B are formed from a plate copper with gold as thin as about 0.5 micron, and each of the conductive inner leads 11B is about 70 microns in width and about 35 microns in thickness. A rectangular aperture 11C is formed in the resin film member 11A, and the conductive inner leads 11B extend on the top surface of the resin film member 11A. The conductive inner leads 11B have leading end portions, respectively, and the leading end portions project into the space over the aperture 11C. At the leading end portions of the conductive inner leads 11B are respectively formed bumps 11D each having a projecting surface on the reverse side of the conductive inner lead 11B and a depressed surface on the front side of the conductive inner lead 11B. With the projecting and depressed surfaces, the dome-shaped bump 11D takes place at the leading end portion of the conductive inner lead 11B.

Drawing Apparatus

Figure 6:
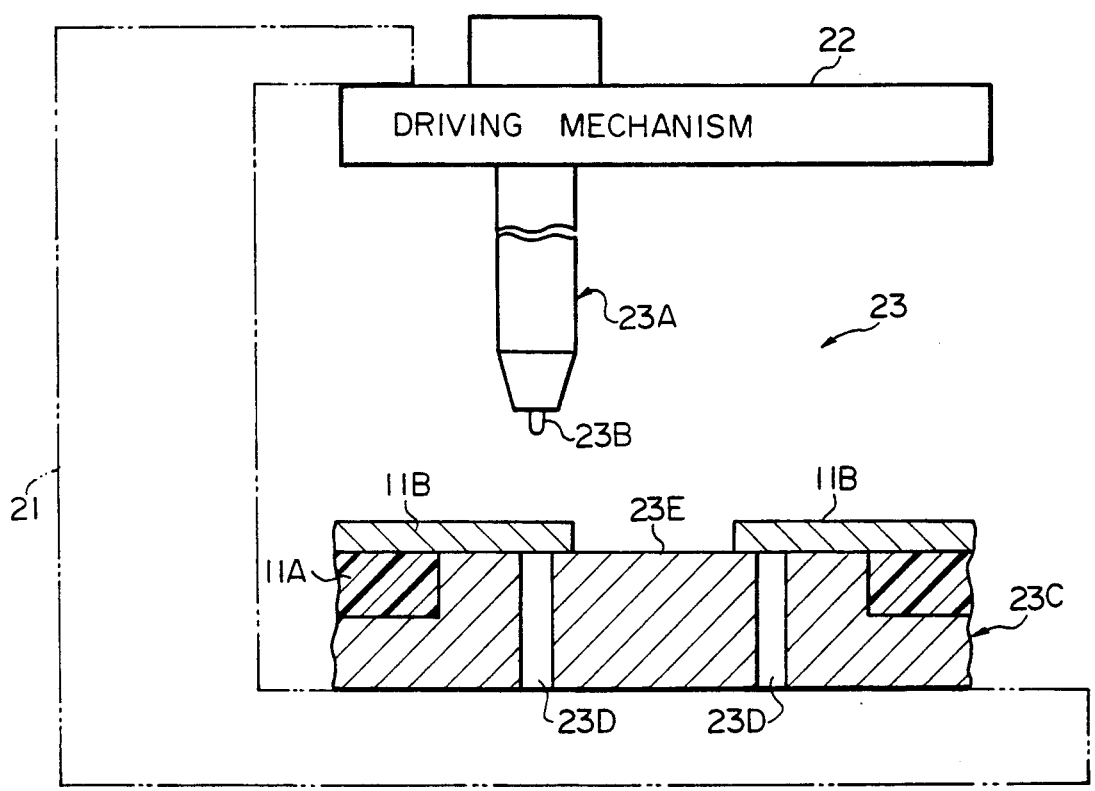
FIG. 6 is a cross sectional view showing a punch and a die forming parts of a drawing apparatus for forming the film carrier shown in FIG. 4.

Turning to FIG. 6 of the drawings, a drawing apparatus according to the present invention is illustrated and largely comprises a frame 21, a driving mechanism 22 supported by the frame 21 and a drawing die unit 23. The drawing die unit 23 has a punch 23A with a protrusion 23B and a die 23C formed with a plurality of recesses 23D equal in number to the conductive inner leads 11B. The protrusion 23B is about 30 microns in diameters, and each recess 23D is as large in diameter as about 50 microns. In this instance, the punch 23A serves as a male die, and the die 23C is of the female die. The punch 23A is attached to the driving mechanism 22, and the driving mechanism 22 drives the punch 23A in a lateral direction, a perpendicular direction to the lateral direction and a vertical direction so that the punch 23A is movable toward any one of the recesses 23D. A land portion 23E is formed at the center area of the female die 23C, and is inserted into the aperture 11C formed in the resin film member 11A. Then, the conductive inner leads 11B extend on the top surface of the land portion 23E, and the recesses 23D are respectively covered with the leading end portions of the conductive inner leads 11B.

Formation Process

Figure 7A:
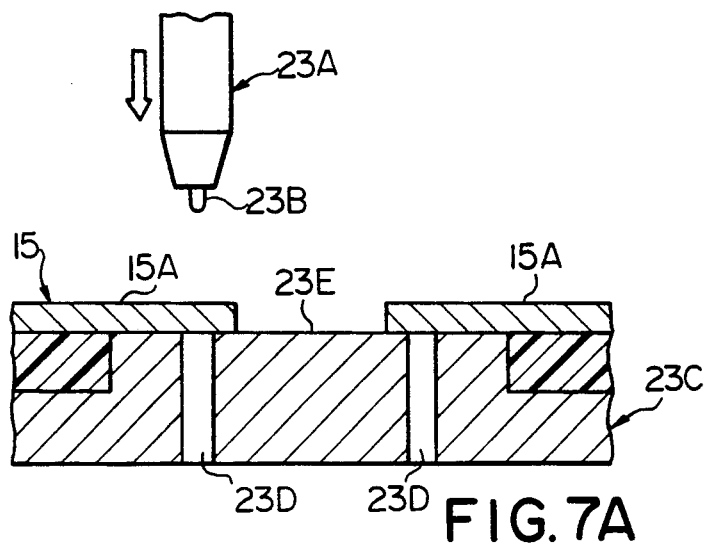
FIGS. 7A to 7C are cross sectional views showing a process sequence for forming the film carrier shown in FIG. 4.
Figure 7B:
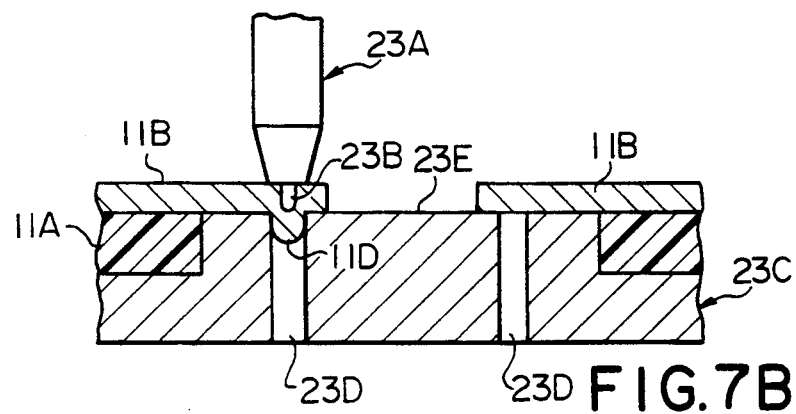
Figure 7C:
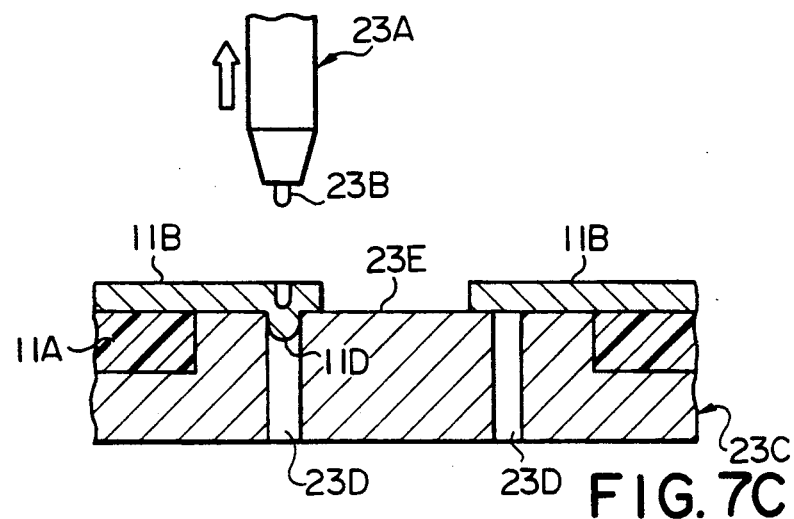

Description is made on a process sequence for forming the film carrier 11 shown in FIGS. 4 and 5 with reference to FIGS. 7A to 7C. The process sequence starts with preparation of a film carrier 15 without any bump and the drawing apparatus shown in FIG. 6. The film carrier 15 is placed on the female die 23C in such a manner that the conductive inner leads 15A cover the recesses 23D, respectively. In this stage, the punch 23A remains over the female die 23C as shown in FIG. 7A.

The driving mechanism 22 pushes the punch 23A downwardly, and the protrusion 23B is brought into contact with one of the conductive inner leads 15A. The driving mechanism 22 further pushes the punch 23A so that the conductive inner lead 15A is subjected to deformation as shown in FIG. 7B. The bump 11D is, thus, formed in the conductive inner lead 11B, and the protrusion 23B remains in the recess 23D together with the bump 11D.

The driving mechanism 22 lifts the punch 23A as shown in FIG. 7C and moves the punch 23A to a position over another recess 23D. When the bumps 11D are formed in all of the conductive inner leads 11B, the film carrier 11 is replaced with a film carrier without any bump.

Figure 8:
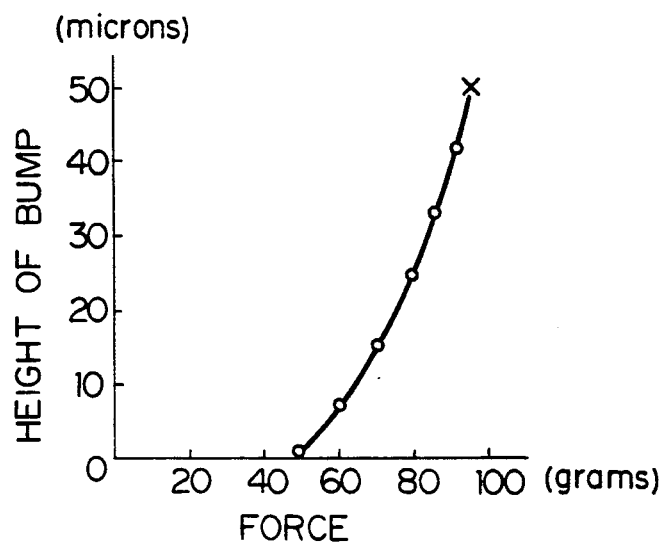
FIG. 8 is a graph showing a height of a bump in terms of a force exerted on a punch for deforming a conductive lead according to the present invention.

FIG. 8 is a graph showing the height of the bump 11B in terms of a force applied to the punch 23A. If the force is not greater than 50 grams, the conductive inner lead 11B is hardly deformed. The height of the bump 11D is varied from zero to about 40 microns by changing the force between about 50 grams and about 90 grams. However, if the force is equal to or greater than about 95 grams, the protrusion 23B breaks the bump 11D. When the force is adjusted to about 85 grams, the bump 11D is about 50 microns in diameter and about 30 microns in height, and is available in a later stage where the film carrier 11 is bonded to a semiconductor chip.

Figure 9:
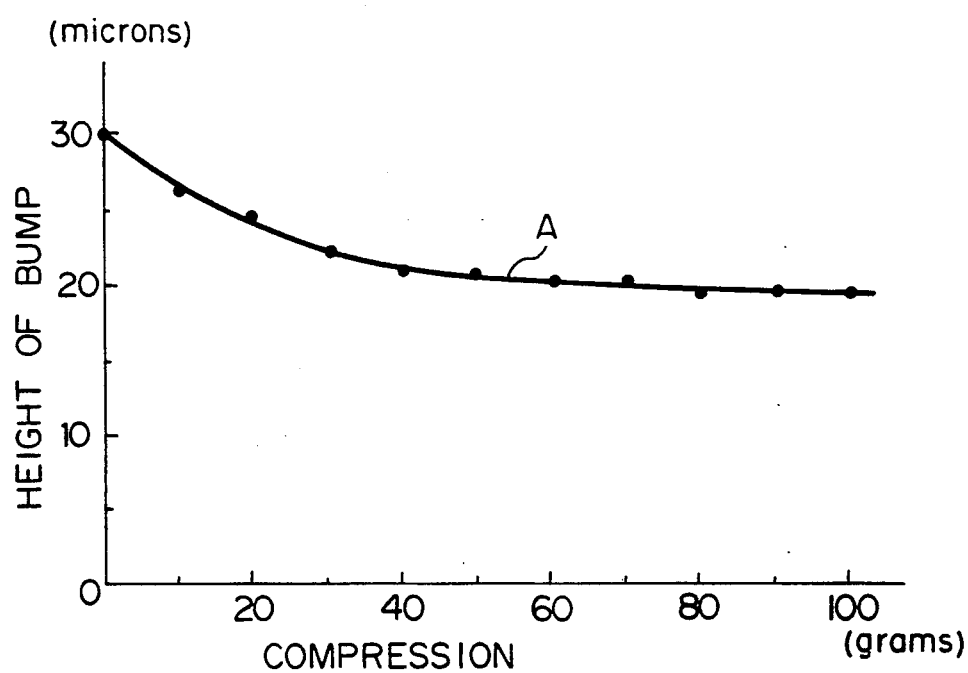
FIG. 9 is a graph showing variation in height of the bump in terms of compression.

FIG. 9 is a graph showing variation in height in terms of compression. In detail, the bump as high as about 30 microns is pressed by a punch with a flat surface of about 100 microns in diameter against a flat die. If the compression exerted on the bump is gradually increased, the bump is deformed, and the height thereof is gradually decreased as indicated by plots A. However, plots A teaches us a saturating region between about 50 grams and about 80 grams, and we expects the bumps to be regulated in height within the saturating region. The reason why the saturating region takes place is that the contact area of the bump is increased by deformation and, accordingly, a compression per a unit area is decreased.

Figure 10:
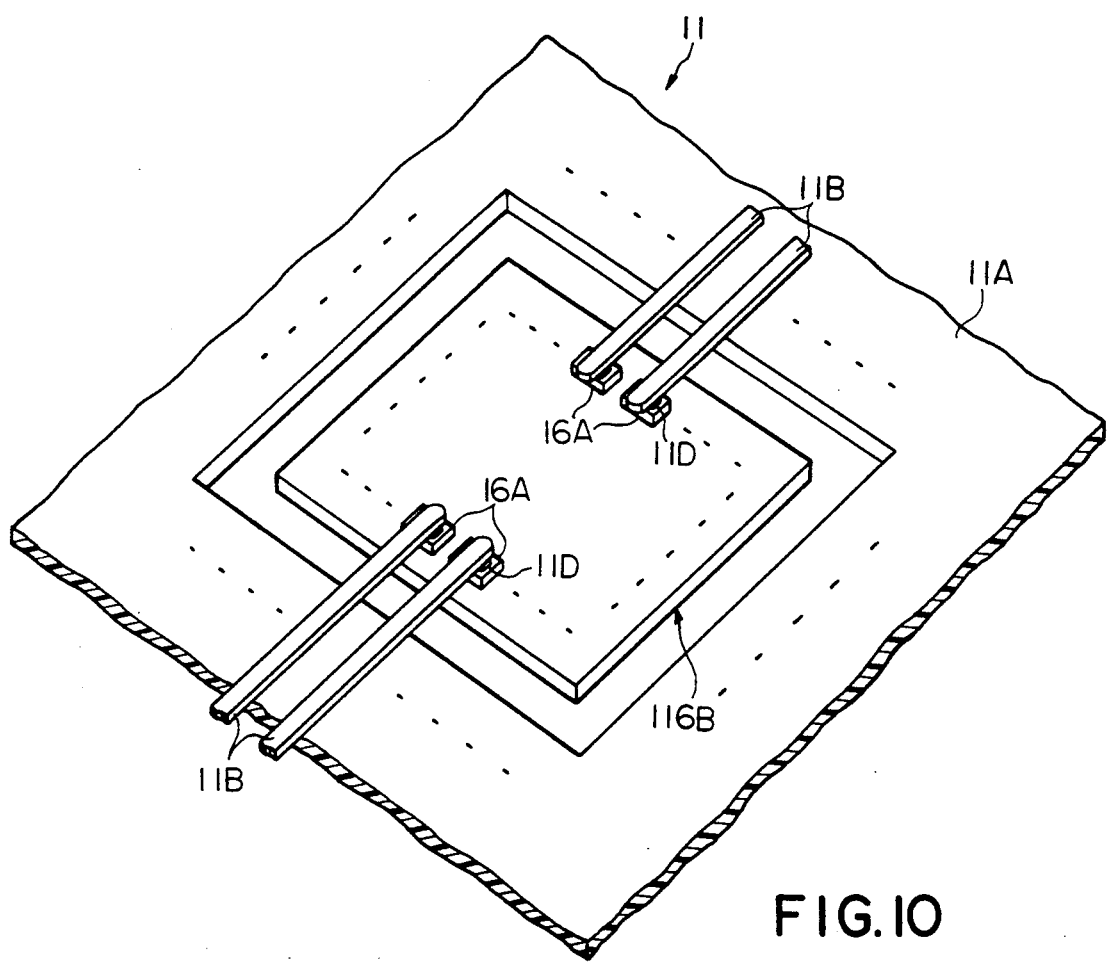
FIG. 10 is a perspective view showing a semiconductor chip assembled with the film carrier according to the present invention.

Thus, the dome-shaped bump 11D is deformable and takes up irregularity in height. As a result, all of the bumps 11D are fixedly bonded to aluminum pads 16A of a semiconductor chip 16B as shown in FIG. 10, and any electrical disconnection hardly takes place therebetween. In fact, the conductive inner leads 11B are respectively bonded to the aluminum pads 16A through a thermocompression bonding process where the semiconductor chip 16B and a bonding tool (not shown) are respectively heated to about 275 degrees in centigrade and about 450 degrees in centigrade, a compression is adjusted to about 60 grams per a lead and a cycle time period is about 1 second, and it is confirmed that the bonding is strong enough against an usual pulling force and that good electrical properties are achieved between the semiconductor chip 16B and the film carrier 11. Moreover, as described in conjunction with the prior art example, the irregularity not greater than 0.5 micron is required the bumps 2E; however, irregularity of about 5 microns is acceptable for the bumps 11D, and no disconnection takes place between the bumps 11D and the associated pads 16A. The cycle time period is about 1 second according to the present invention, and is a half or a third of that of the process disclosed in Japanese Patent Publication 64-10094. Such a short cycle time results in improvement in throughput and, accordingly, the productivity of a semiconductor device.

Second Embodiment

Structure of Film Carrier

Figure 11:
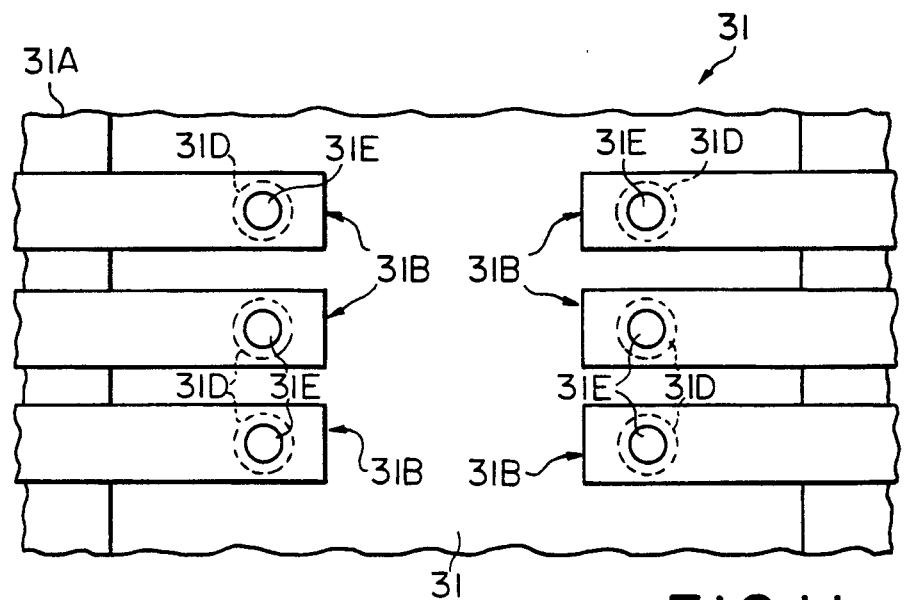
FIG. 11 is a plan view showing a part of another film carrier according to the present invention.
Figure 12:
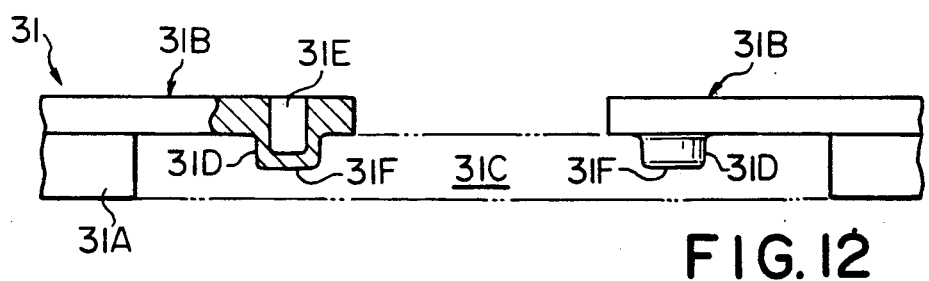
FIG. 12 is a partially cut-away side view showing the film carrier shown in FIG. 11.
Figure 13:
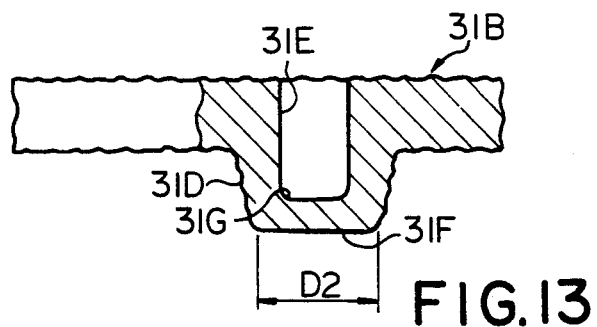
FIG. 13 is a cross sectional view showing, in an enlarged scale, the leading end portion of the conductive inner lead shown in FIG. 12.

Turning to FIGS. 11 and 13 of the drawings, another film carrier 31 embodying the present invention is illustrated and largely comprises a thin film member 31A and a plurality of conductive inner leads 31B. A rectangular aperture 31C is formed in the film member 31A, and the conductive inner leads 31B extend on the top surface of the film member 31A. The conductive inner leads 31B have respective leading end portions which project into a space over the aperture 31C, and bumps 31D are formed in the leading end portions, respectively. Each of the bumps has a projecting surface projecting from the reverse side surface of the conductive inner lead 31B and a depressed surface defining a cavity 31E, and the projecting surface has a flat portion 31F at the leading end thereof. Although each of the bumps 31D has the flat portion 31F, the bump 31D is substantially uniform in thickness. This is because of the fact that the bottom surface of the cavity 31E is also flat and in parallel to the flat surface 31F. Moreover, the bottom surface of the cavity 31E is curved at the periphery thereof 31G and is smoothly merged into the side surface of the cavity 31E. This results in the uniformity in thickness of the bump 31D. In this instance, the conductive inner leads 31B are about 70 microns in width and about 35 microns in thickness. The conductive inner leads 31B are formed from a copper thin film covered with gold as thin as about 0.5 micron. The surface roughness of each conductive inner lead 31B is of the order of 0.5 micron, however, the flat surface 31F is about 40 microns in diameter D2 and about 0.05 micron in surface roughness. The bump 31D is about 30 microns in height, and the irregularity thereof is fallen with the range between −1 micron and +1 micron.

Figure 14:
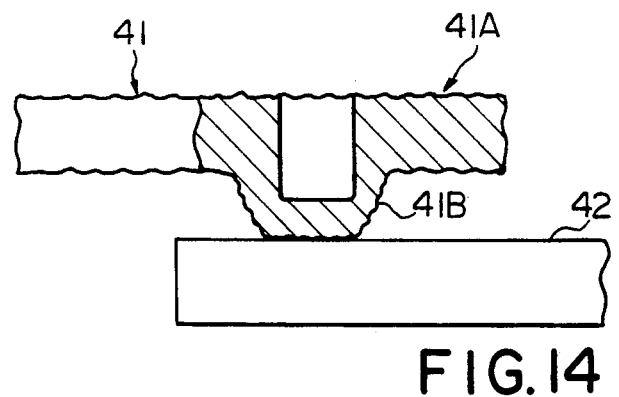
FIG. 14 is a partially cut-away side view showing a conductive inner lead bonded to a pad.
Figure 15:
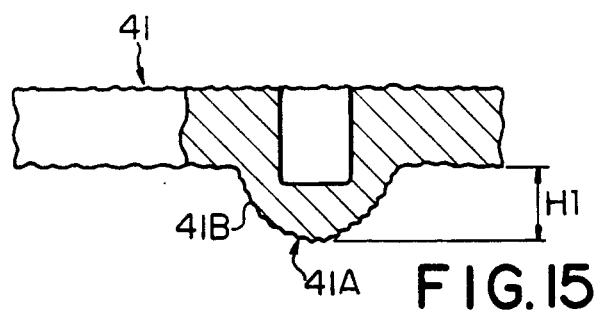
FIG. 15 is a cross sectional view showing the conductive inner lead shown in FIG. 14 prior to being assembled.
Figure 16:
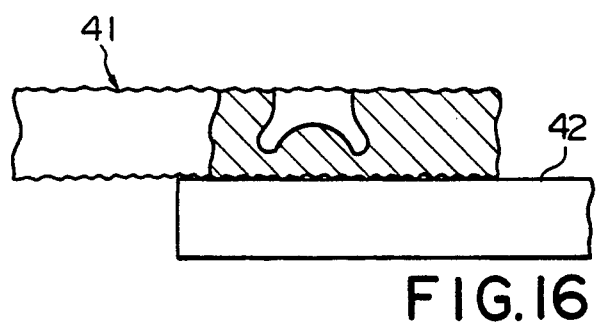
FIG. 16 is a partially cut-away side view showing the conductive inner lead bonded to the pad with a force larger than that applied to the conductive inner lead shown in FIG. 14.

The flat portion 31E as well as the uniformity in thickness aim at preventing the bump 31D from crash upon a thermocompression bonding. In detail, assuming now that a conductive inner lead 41 is about 0.5 micron in surface roughness (see FIG. 14) and that a bump 41A with a height H1 of about 30 microns is as rough as the conductive inner lead 41, the bump 41A with a curved projecting surface 41B (see FIG. 15) is bonded to a pad 42 through a thermocompression bonding process, but is relatively small in contact area to due to the large surface roughness. Then, the conductive inner lead 41 is liable to be disconnected from the pad 42 with a relatively small force. In order to enhance the bonding strength, it is necessary to increase the amount of contact area, and the amount of contact area is usually increased by increasing the force applied to the bump 41B during the thermocompression bonding process because the force applied to the bump 41B is expected to smoothen the surface roughness. However, a force large enough to smoothen the surface of the bump is too large to maintain the bump 41B. In fact, when the large force is applied to the bump 41B, the bump per se is crashed as shown in FIG. 16, and no desirable contact is achieved at the entire surface of the conductive inner lead 41. However, if the leading end of a bump is flattened as the bump 31D, the bump is improved in strength against the force, and the surface of the bump is smoothed without any crash. Moreover, the bottom surface of the cavity 31F is curved at the periphery 31G and smoothly merged into the side surface as described hereinbefore, and this smooth configuration prevents the bump from stress concentration, thereby increasing the strength against the force.

Drawing Apparatus

Figure 17:
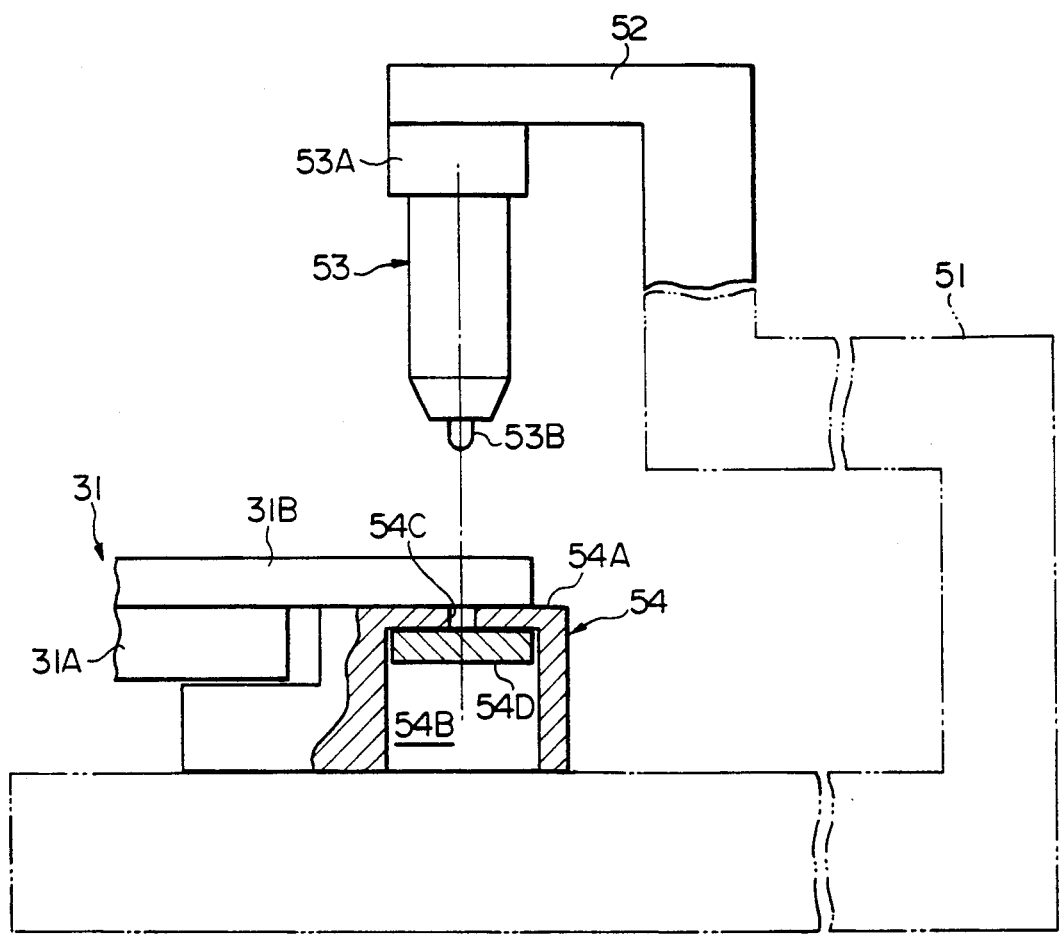
FIG. 17 is a partially cut-away side view showing a drawings apparatus according to the present invention.

Turning to FIG. 17 of the drawings, a drawing apparatus according to the present invention comprises a frame 51, a two-dimensional driving mechanism 52, a punch unit 53 upwardly and downwardly movable with respect to the two-dimensional driving mechanism 52 and serving as a male die, an actuator 53A associated with the punch unit 53, and a female die unit 54. The punch unit 53 has a small protrusion 53B, and the small protrusion 53B is about 30 micron in diameter. The small protrusion 53B is rounded at the leading end thereof, and the rounded leading end is about 3 microns in length. The female die unit 54 has a land portion 54A where the conductive inner leads 31B extend, and hollow space 54B is formed beneath the land portion 54A. A small die hole 54C is formed in the top surface of the land portion 54A, and is closed with a back plate member 54D. The small die hole 54C is about 50 microns in diameter and about 30 microns in depth.

Figure 18A:
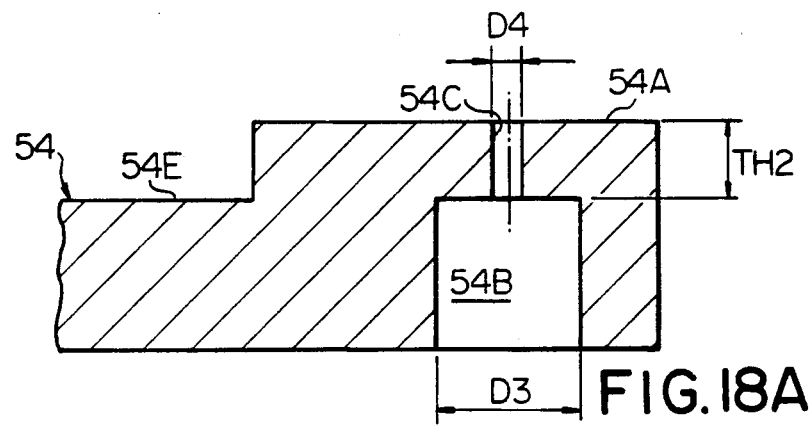
FIGS. 18A to 18C are cross sectional views showing a process sequence for producing a female die unit incorporated in the drawings apparatus shown in FIG. 17.
Figure 18B:
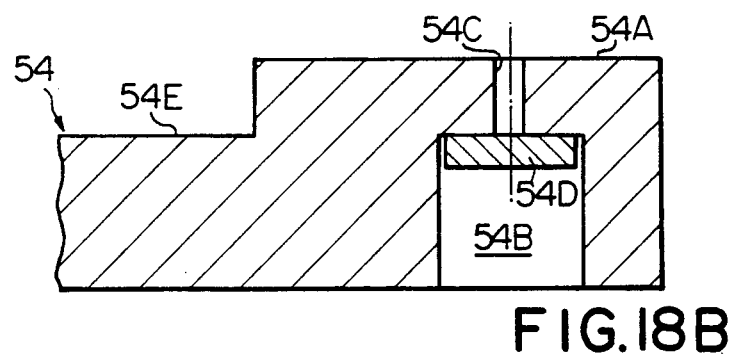
Figure 18C:
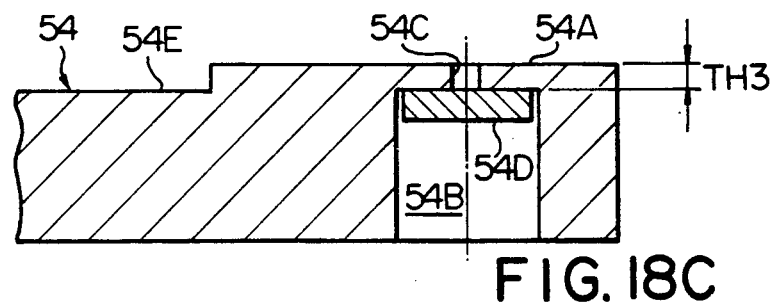

The small die hole 54C is formed as follows. First, a block member 54E is drilled from the reverse side thereof so that the hollow space 54B is formed with a diameter D3 of about 1 millimeter. The depth of the hollow space 54B is determined in such a manner that the land portion 54A is as thin as about 200 microns, and the thickness TH2 of the land portion 54A in this stage is designated by "TH2" in FIG. 18A. Subsequently, the block member 54E with the hollow space 54B is subjected to an electric spark from the front side thereof, and the die hole 54C with the diameter D4 of about 50 microns is formed in the land portion 54A. The resultant structure of this stage is illustrated in FIG. 18A. The back plate member 54D is grinded to the surface roughness of about 0.01 micron, and is secured to the land portion 54A as shown in FIG. 18B. Finally, the land portion 54A is grinded to a thickness TH3 of about 30 microns, and the resultant structure is illustrated in FIG. 18C.

Formation Process

A process sequence starts with placing a film carrier without any bump on the female die unit 54. One of the conductive inner leads is aligned with the small die hole 54C, and the two-dimensional driving mechanism 52 allows the protrusion 53B to be located over the die hole 54C. Then, the actuator 53A causes the punch unit 53 to downwardly move, and the protrusion 53B deforms the conductive inner lead for forming the bump 31D at the leading end portion thereof. When the force applied from the protrusion 53B to the conductive inner lead is adjusted to about 85 gf, the dome-shaped bump 41A as high as about 30 microns is formed on the leading end portion of the conductive inner lead 41 as shown in FIG. 15, however, if the force exceeds 85 gf, a flat surface takes place at the leading end thereof due to a crash between the protrusion 53B and the back plate member 54D. When the force reaches about 105 gf, the flat surface 31G is produced, and the diameter and the surface roughness are about 40 microns and about 0.05 micron, respectively. However, the height of the bump 31D is fallen within the range between about 29 microns and about 31 microns.

After formation of the bumps 31D on the leading end portions of the conductive inner leads 31B, the film carrier is assembled to a semiconductor chip (not shown), and the bumps 31D (the height of each bump is fallen within the range between about 29 microns and about 31 microns) are fixed to aluminum pads produced on the semiconductor chips through a thermocompression bonding process. The semiconductor chip is heated to about 275 degrees in centigrade, and a bonding tool is as high as about 450 degrees in centigrade. Each of the bumps 31D is pressed by the bonding tool against the aluminum pad at about 60 gf for 1 second. The bumps 31D are securely bonded to the aluminum pads, respectively, even though the bumps 31D has the irregularity in height between +1 micron and −1 micron. This is because of the fact that the bumps are much liable to be deformed by virtue of the recesses 31E.

Figure 19:
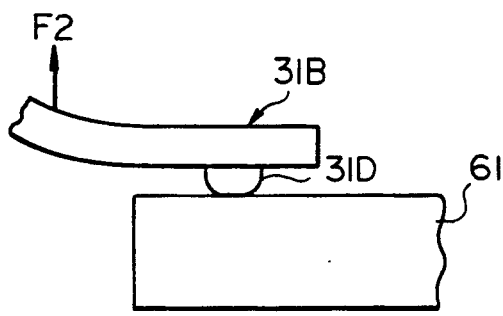
FIG. 19 is a side view showing an evaluation stage for a bonding strength between a bump and a pad.

For evaluation of the bonding strength between the bump 31D and the aluminum pad 61, the conductive inner lead 31B is upwardly pulled as shown in FIG. 19. A force F2 is gradually increased until the bump 31D is separated from the aluminum pad 61, and it is confirmed that the bonding strength is greater than 50 gf.

Subsequently, an influence of the surface roughness on the bonding strength is examined. Namely, various bumps 31D are formed with the flat surfaces the surface roughness of which ranges from 0.05 micron to 0.5 micron, and the bumps are respectively bonded to the aluminum pads 61 through the thermocompression bonding process. The conditions are similar to those described hereinbefore, and the bonding strength is measured for each of the bumps. The bonding strength is decreased by increasing the surface roughness because the contact area is decreased with the surface roughness. For a stable connection between the bump and the aluminum pad, it is desirable for the bonding strength to be equal to or greater than 40 gf. If the surface roughness is greater than 0.2 micron, the bonding strength is smaller than 40 gf. Then, it is necessary for the flat surface 31F to have the surface roughness equal to or less than 0.2 micron.

As described hereinbefore with reference to FIG. 16, when a bump is crashed, the conductive inner lead 41 as a whole is brought into contact with the aluminum pad 42, and no stable connection is achieved therebetween. This is because of the fact that the bump per se is crashed before smoothing the surface roughness. In fact, a force of about 80 gf/lead is large enough to crash a bump with a height of about 10 microns. However, it is necessary for the bump as large as 0.5 micron in surface roughness to be subjected to a force of about 150 gf/lead for decreasing the surface roughness to about 0.2 micron. This means that a stable contact is hardly achieved by merely increasing the force applied in the thermocompression bonding. Moreover, in order to achieve the stable connection, it is desirable for the bump to have a height equal to or greater than about 10 microns.

Figure 20:
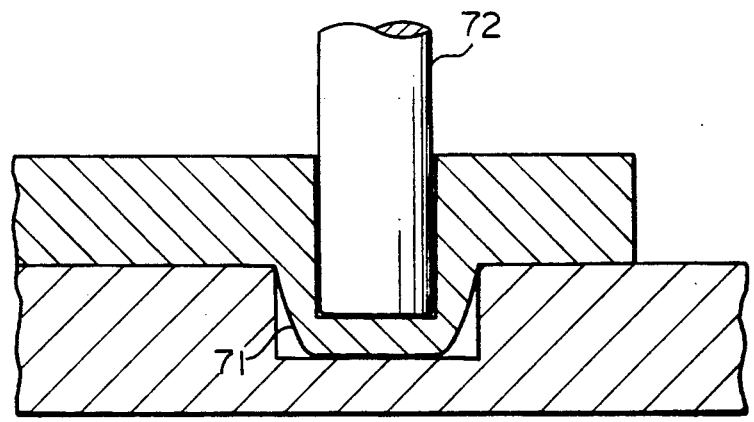
FIG. 20 is a cross sectional view showing a drawing die unit for forming a bump without uniformity in thickness.

Finally, stability or reliability of the connection between the bump and the pad is evaluated through a thermal impact. A heat cycle between +120 degrees and −40 degrees in centigrade per an hour is repeatedly applied thereto five hundred times, no inferior connection takes place between the bumps 31D and the aluminum pad. However, 5% of bumps 71 shown in FIG. 20 suffer from inferior connection because the bumps 71 are not uniform in thickness due to a punch 72 without any round leading edge.

As will be understood from the foregoing description, the bump 31D easily takes up an irregularity in height and achieves a stable or reliable connection to a pad by virtue of the flat surface 31F as well as of the uniformity in thickness.

Third Embodiment

Structure of Film Carrier

Figure 21:
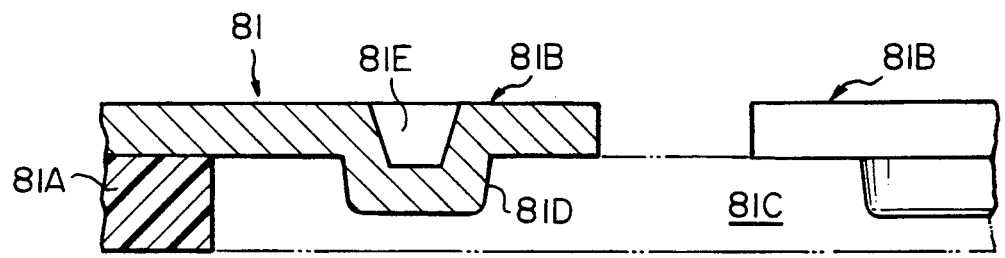
FIG. 21 is a partially cut-away side view showing still another film carrier embodying the present invention.

Turning to FIG. 21 of the drawings, still another film carrier 81 embodying the present invention is illustrated and largely comprises a thin film member 81A and a plurality of conductive inner leads 81B. Each of the conductive inner leads 81B has a leading end portion projecting into a space over an aperture 81C formed in the film member 81A, and a bump 81D is formed on the reverse side surface of each conductive inner lead 81B. The bump 81D has a projecting surface projecting from the reverse side surface into the aperture and a depressed surface defining a recess 81E open to the front surface of the conductive inner lead 81B. The recess 81E is formed in an inverted frusto-conical configuration, and, accordingly, the bottom surface of the recess 81E is smaller in area than the top surface coplanar to the front side surface of the conductive inner lead 81B. In this instance, the conductive inner lead 81B is about 70 microns in width and about 35 microns in thickness, and each conductive inner lead 81B is spaced from the adjacent conductive inner lead 81B at an interval of about 140 microns.

The inverted frusto-conical recess 81E allows a punch unit to easily leave from the conductive inner lead 81B, and, for this reason, the conductive inner lead 81B is hardly bent by the punch unit.

Drawing Apparatus

Figure 22:
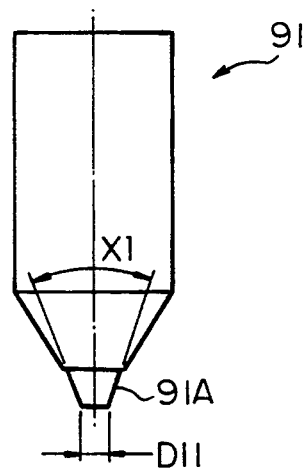
FIG. 22 is a side view showing a punch unit used in a drawing apparatus for forming the bump shown in FIG. 21.

A drawing apparatus for forming the bump shown in FIG. 21 is similar in structure to that shown in FIG. 17 with the exception of a punch unit 91 shown in FIG. 22. The punch unit 91 has a protrusion 91A, and the protrusion 91A is formed in an inverted frusto-conical configuration. The protrusion 91A is about 30 microns in diameter D11, and angle X1 is adjusted to about 60 degrees. A female die 92 coupled to the punch unit 91 is similar to the female die 54 shown in FIG. 17, and has a die hole 92A of about 50 microns in diameter and about 30 microns in depth (see FIGS. 23A to 23C). With the punch unit 91, the frusto-conical recess 81E is formed in the conductive inner lead 81B through a process sequence described hereinbelow.

Formation Process

Figure 23A:
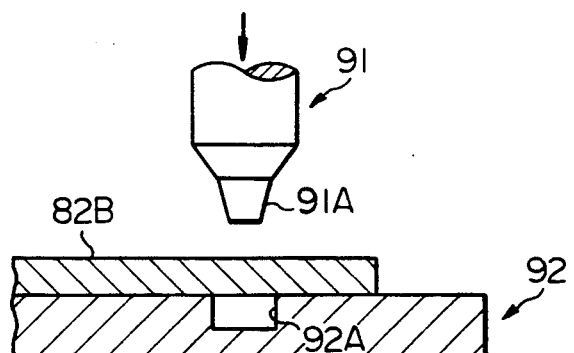
FIGS. 23A to 23C are cross sectional views showing the process sequence for forming the bump shown in FIG. 21.
Figure 23B:
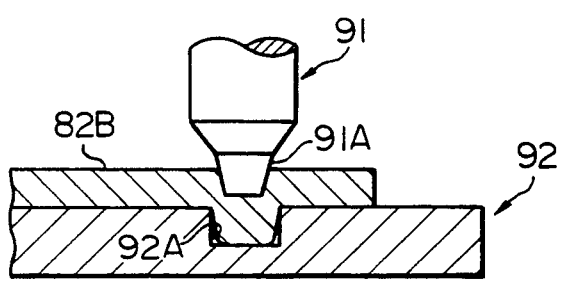
Figure 23C:
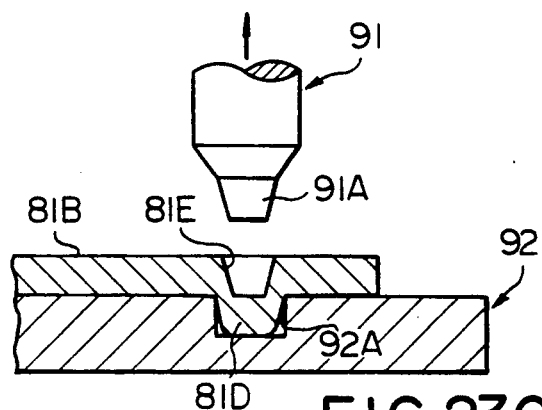

The process sequence starts with preparation of the drawing apparatus and a film carrier without any bump. The conductive inner lead 82B without any bump is placed in such a manner as to cover the die hole 92A, and the punch unit 91 is aligned with the die hole 92A but is located over the conductive inner lead 82B in this stage as shown in FIG. 23A. The punch unit 91 is moved downwardly, and the protrusion 91A deforms the conductive inner lead 82B, thereby forming a bump on the reverse side surface of the conductive inner lead 82B as shown in FIG. 23B. After being brought into contact with the conductive inner lead 82B, the punch unit 91 further moves downwardly by about 30 microns. The punch unit 91 is then moved upwardly, and the conductive inner lead 81B with the bump 81D is left on the female die unit 92 as shown in FIG. 23C. The bump 81D thus formed have an irregularity ranging between −1 micron and +1 micron in height. By virtue of the inverted frusto-conical recess 81E, the punch unit 91 smoothly leaves from the conductive inner lead 82B. In fact, the conductive inner lead 81B is bent at the leading end thereof by only 1 micron.

Figure 24:
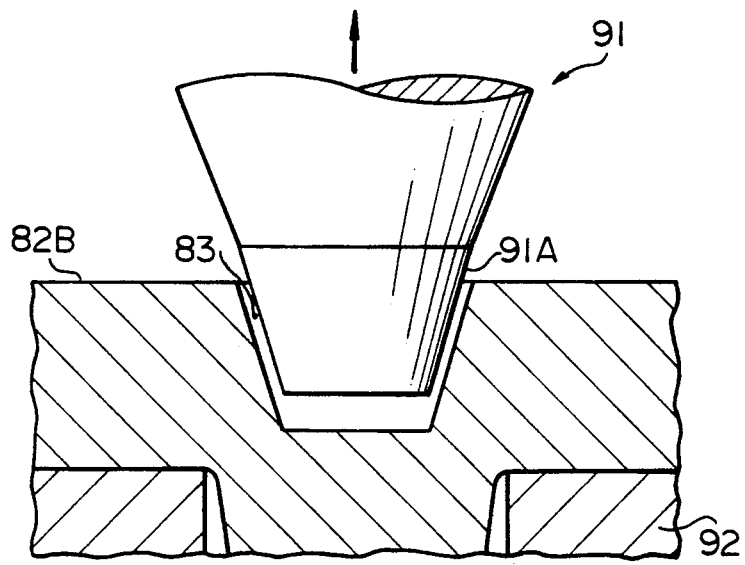
FIG. 24 is a cross sectional view showing, in an enlarged scale, the bump shown in FIG. 21.
Figure 25:
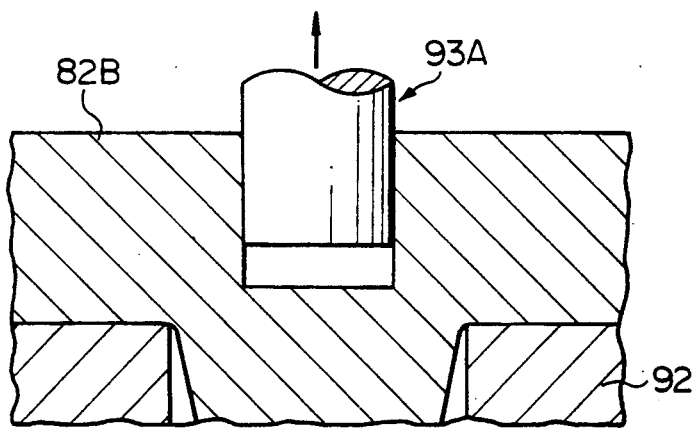
FIG. 25 is a cross sectional view showing a bump different in the configuration of recess from that shown in FIG. 24.
Figure 26:
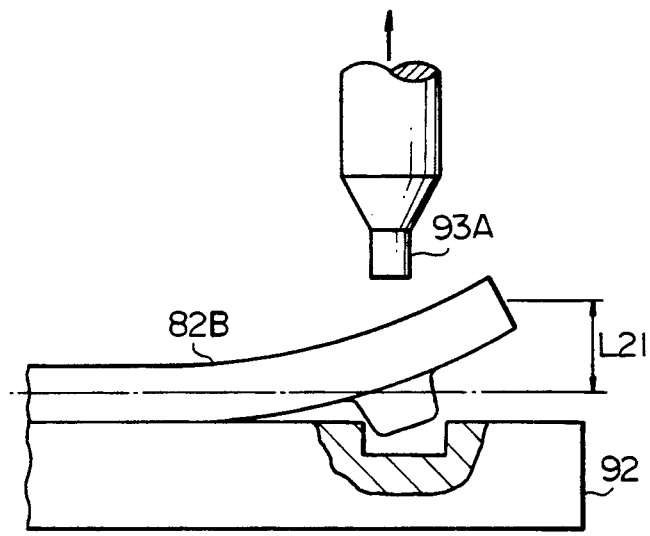
FIG. 26 is a partially cut-away side view showing a drawback inherently taking place in the bump shown in FIG. 25.

This advantage is described in detail with reference to FIGS. 24 to 26. Assuming now that the punch unit 91 and another punch unit with a column shaped protrusion 93A respectively deform conductive inner leads 82B as shown in FIGS. 24 and 25, a space 83 is formed between the conductive inner lead 82B and the punch unit 91A by lifting the punch unit 91 upwardly, however, no space takes place between the protrusion 93A and the conductive inner lead 82B. This means that the column shaped protrusion 93A is tightly received in a recess, and, for this reason, the conductive inner lead 82B tends to be bent upwardly as shown in FIG. 26. In fact, the conductive inner lead 82B is deformed at the leading end thereof by L21 ranging from 30 microns to 50 microns. The conductive inner lead 82B thus bent tends to fail to contact with a pad of a semiconductor chip.

The film carrier 81 is assembled with a semiconductor chip (not shown) through a thermocompression bonding process, and the semiconductor chip and a pressing tool (not shown) are respectively heated to about 275 degrees and about 450 degrees in centigrade. The pressing tool presses the bump 81D against an aluminum pad of the semiconductor chip at about 60 gf/lead for a second. The bump 81D is bonded to the aluminum pad, and the connection between the bump 81D and the aluminum pad achieves a large bonding strength and good electrical properties even though the irregularity between −1 micron and +1 micron takes place.

The bump 81D of this embodiment achieves a good connection between the conductive inner lead 81B and a pad on a semiconductor chip because the conductive inner lead 81B is hardly bent in the formation process of the bump 81D.

Fourth Embodiment

Structure of Film Carrier

Figure 27:
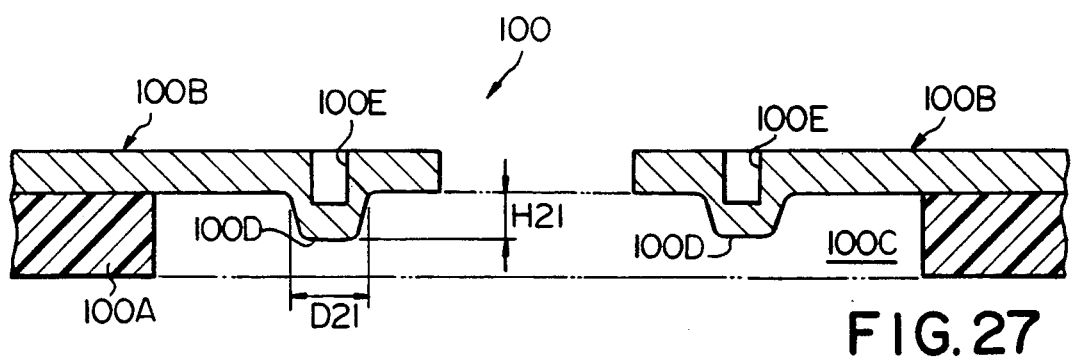
FIG. 27 is a cross sectional view showing still another film carrier according to the present invention.

Turning to FIG. 27 of the drawings, still another film carrier 100 embodying the present invention is illustrated and largely comprises a thin film member 100A and a plurality of conductive inner leads 100B. Each of the conductive inner leads 100B has a leading end portion projecting into a space over an aperture 100C formed in the film member 100A, and a bump 100D is formed on the reverse side surface of each conductive inner lead 100B. The bump 100D has a projecting surface projecting from the reverse side surface into the aperture and a depressed surface defining a recess 100E open to the front surface of the conductive inner lead 100B. The recess 100E is formed in a column configuration, and, accordingly, the recess 100E is substantially constant in cross section. In this instance, the conductive inner lead 100B is about 80 microns in width and about 35 microns in thickness, and each conductive inner lead 100B is spaced from the adjacent conductive inner lead 100B at an interval of about 160 microns. The conductive inner leads 100B are formed from a plate copper with gold as thin as about 1 micron. The bump 100D is about 50 micron in diameter D21 and about 30 microns in height H21.

Drawing Apparatus

Figure 28:
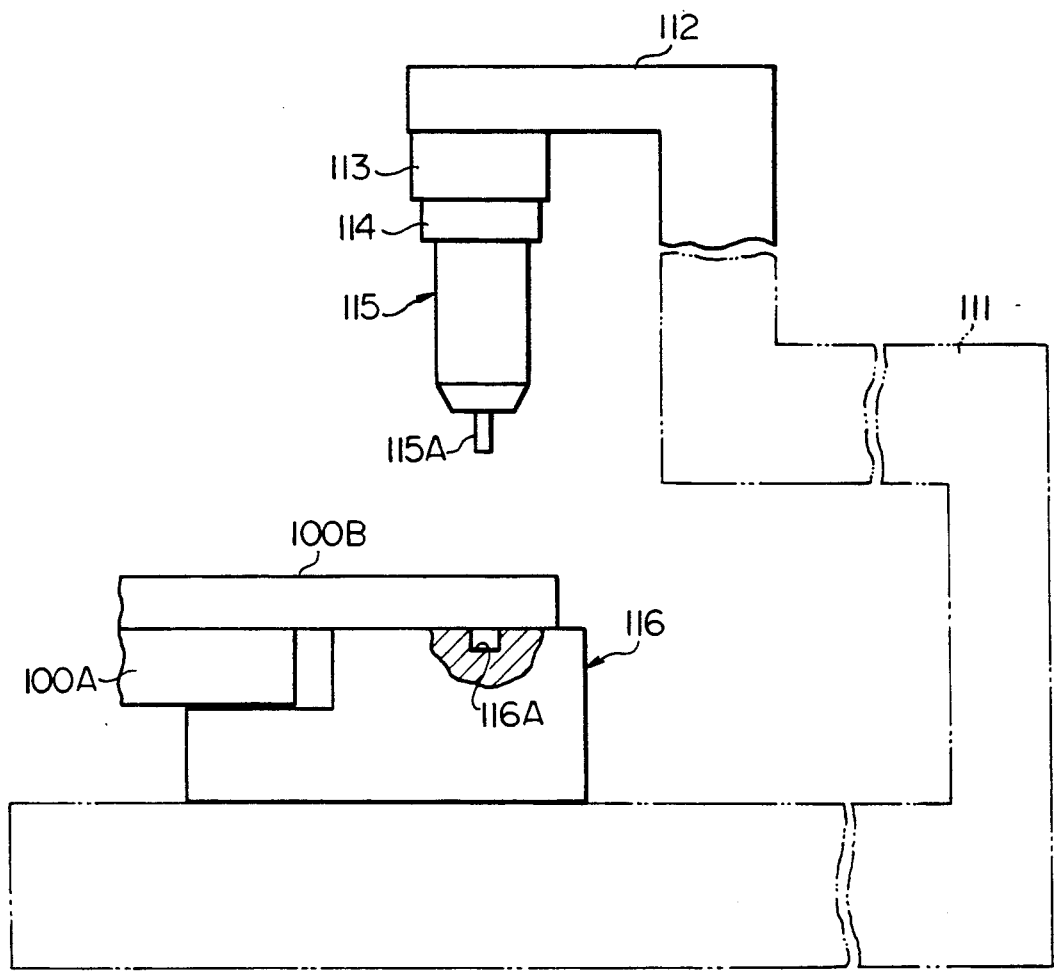
FIG. 28 is a side view showing a drawing apparatus used for formation of a bump without any deformation.

A drawing apparatus used for formation of the bump 100D is illustrated in FIG. 28 and largely comprises a frame 111, a two-dimensional driving mechanism 112, an actuator 113 for vertical movement, a rotational mechanism 114, a punch unit 115 with a protrusion 115A, and a female die unit 116 with a die hole 116A. The protrusion is about 30 microns in diameter, and the die hole 116A is about 50 microns in diameter. The two-dimensional driving mechanism 112 drives the punch unit 115 in two directions perpendicular to each other, and the protrusion 115A of the punch unit 115 can be aligned with the die hole 116A. The actuator 113 moves the punch unit 115 downwardly and upwardly with respect to the frame 111, and the protrusion is driven for rotation by the rotational mechanism 114.

Figure 29:
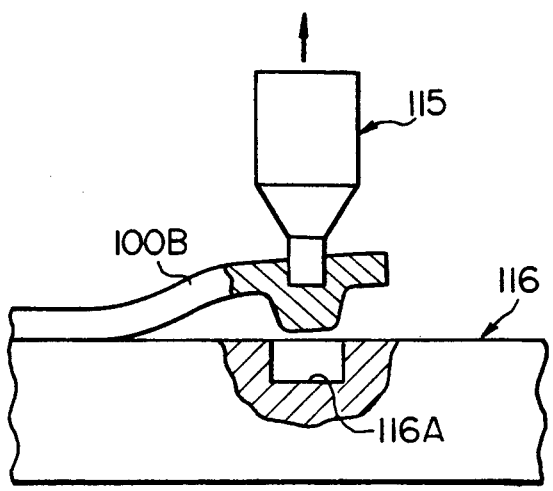
FIG. 29 is a partially cut-away view showing the film carrier shown in FIG. 27 with a punch unit having a column shaped protrusion.

If a drawings apparatus is equipped with the punch unit 115 but without any rotational mechanism 114, the conductive inner lead 100B is much liable to be deformed upon lifting up the punch unit 115 as shown FIG. 29. However, the drawings apparatus shown in FIG. 28 allows the punch unit 115 to smoothly leave from the conductive inner lead 100B because of the rotational motion.

Formation Process

Figure 30A:
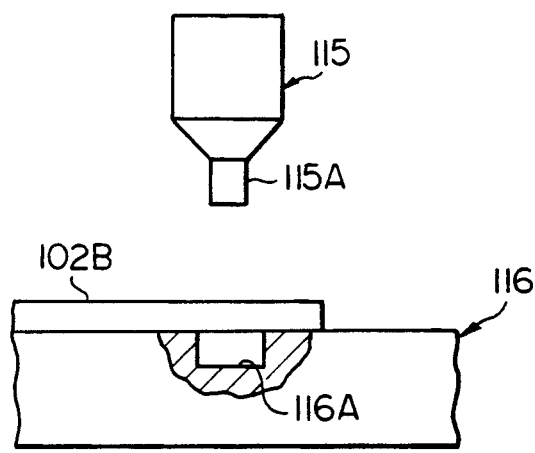
FIGS. 30A to 30C are partially cut-away side views showing a process sequence for forming the film carrier without any deformation.
Figure 30B:
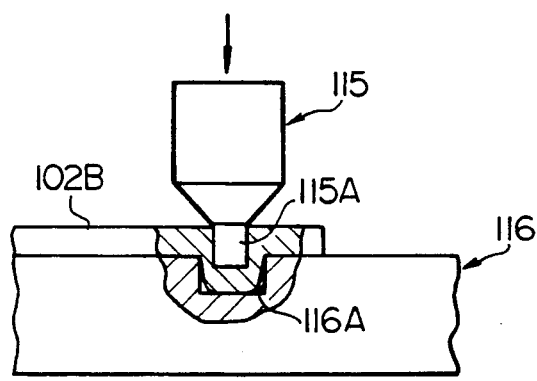
Figure 30C:
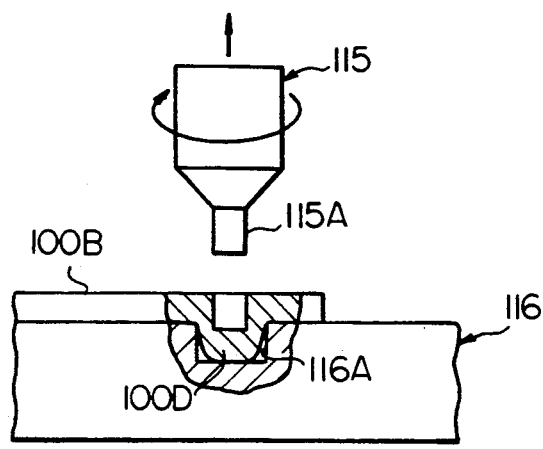

Description is hereinbelow made on a process for forming a bump in a conductive inner lead with reference to FIGS. 30A to 30C. The process sequence starts with preparation of the drawing apparatus shown in FIG. 28 and a film carrier without any bump. The punch unit 115 is aligned with the die hole 116A but is located over the conductive inner lead 82B, then the conductive inner lead 102B without any bump is fixed to the female die unit 116 in such a manner as to cover the die hole 116A as shown in FIG. 30A. The punch unit 115 is moved downwardly, and the protrusion 115A deforms the conductive inner lead 102B, thereby forming a bump on the reverse side surface of the conductive inner lead 102B as shown in FIG. 30B. The punch unit 115 is left on the female die unit 116 as shown in FIG. 30C. The bump 100D thus formed have an irregularity ranging between −3 micron and +3 micron in height, and the diameter of the bump 100D is about 50 microns. No deformation takes place at the leading end of the conductive inner lead 100B because of the rotational motion of the punch unit 115.

The film carrier 100 is assembled with a semiconductor chip (not shown) through a thermocompression bonding process, and the semiconductor chip and a pressing tool (not shown) are respectively heated to about 150 degrees and about 450 degrees in centigrade. The pressing tool presses the bump 100D against an aluminum pad of the semiconductor chip at about 50 gf/lead for a second. The bump 100D is bonded to the aluminum pad, and the connection between the bump 100D and the aluminum pad achieves a large bonding strength and good electrical properies even though the irregularity between −3 micron and +3 micron takes place.

The bump 100D of this embodiment achieves a good connection between the conductive inner lead 100B and a pad on a semiconductor chip because the conductive inner lead 100B is hardly bent in the formation process of the bump 100D.

Fifth Embodiment

Structure of Film Carrier

Figure 31:
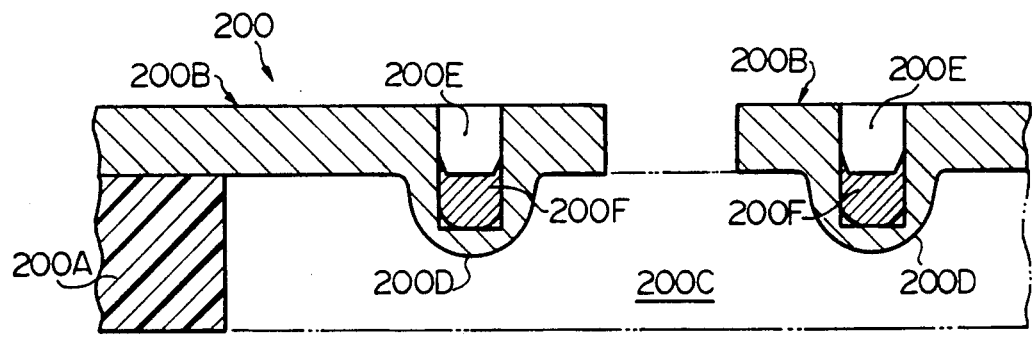
FIG. 31 is a cross sectional view showing still another film carrier according to the present invention.

Turning to FIG. 31 of the drawings, still another film carrier 200 embodying the present invention is illustrated and largely comprises a thin film member 200A and a plurality of conductive inner leads 200B. Each of the conductive inner leads 200B has a leading end portion projecting into a space over an aperture 200C formed in the film member 200A, and a bump 200D is formed on the reverse side surface of each conductive inner lead 200B. The bump 200D has a projecting surface projecting from the reverse side surface into the aperture and a depressed surface defining a recess 200E open to the front surface of the conductive inner lead 200B. The recess 200E is formed in a column configuration, and, accordingly, the recess 200E is substantially constant in cross section. A piece of copper 200F is inserted in the bottom portion of the recess 200E, and the copper is hardly melted at a certain temperature in a thermocompression bonding process described hereinbelow in detail.

In this instance, the conductive inner lead 200B is about 100 microns in width and about 30 microns in thickness, and each conductive inner lead 200B is spaced from the adjacent conductive inner lead 200B at an interval of about 200 microns. The conductive inner leads 200B are formed from a plate copper with gold as thin as about 1 micron. The bump 200D is about 70 micron in diameter and about 30 microns in height. The recess 200E is about 50 microns in diameter, and the piece of copper 200F is as thin as about 25 microns due to deep drawing. An irregularity takes place in the height of bump 200D and ranges from −1 micron to +1 micron.

Drawing Apparatus

Figure 32:
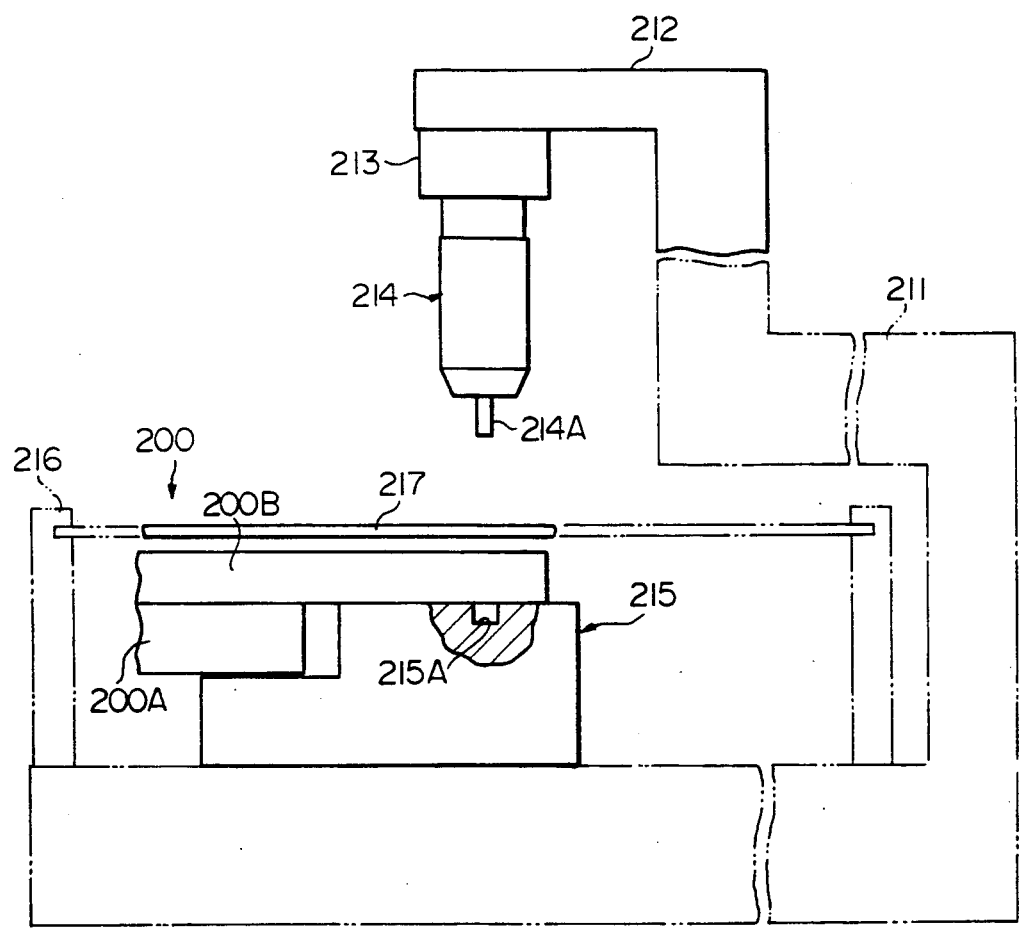
FIG. 32 is a side view showing a drawing apparatus used for formation of the film carrier shown in FIG. 31.

A drawing apparatus used for formation of the bump 200D is illustrated in FIG. 32 and largely comprises a frame 211, a two-dimensional driving mechanism 212, an actuator 213 for vertical movement, a punch unit 214 with a protrusion 214A, a female die unit 215 with a die hole 215A, and a retainer unit 216 for a sheet 217 of copper as thin as about 30 microns. The protrusion 214A is about 50 microns in diameter, and the die hole 215A is about 70 microns in diameter. The two-dimensional driving mechanism 212 drives the punch unit 214 in two directions perpendicular to each other, and the protrusion 214A of the punch unit 214 can be aligned with the die hole 215A. The actuator 213 moves the punch unit 214 downwardly and upwardly with respect to the frame 211, and the retainer 216 allows the sheet of copper 217 over the film carrier 200.

Formation Process

Figure 33A:
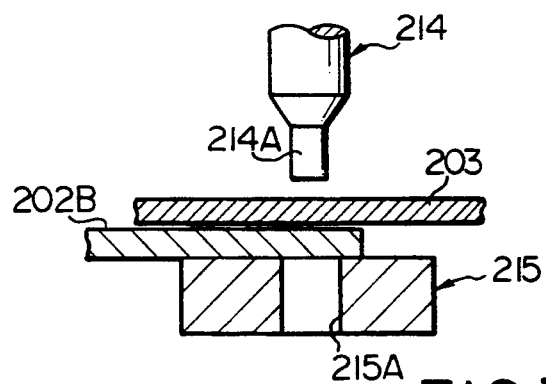
FIGS. 33A and 33B are cross sectional views showing a process sequence for forming the film carrier shown in FIG. 31.
Figure 33B:
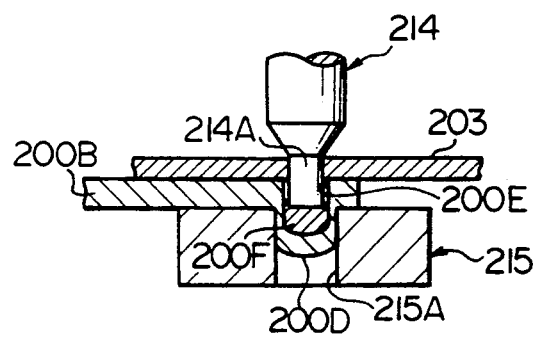

Description is hereinbelow made on a process for forming a bump in a conductive inner lead with reference to FIGS. 33A and 33B. The process sequence starts with preparation of the drawing apparatus shown in FIG. 32 and a film carrier without any bump. The conductive inner lead 202B without any bump is fixed to the female die unit 215 in such a manner as to cover the die hole 215A, and a sheet of copper 203 is located over the conductive inner lead 202B as shown in FIG. 33A. The punch unit 214 is aligned with the die hole 215A but is located over the sheet of copper 203. Then, the punch unit 214 is moved downwardly, and the protrusion 214A breaks the sheet of copper 203 and deforms the conductive inner lead 202B, thereby forming a bump 200D on the reverse side surface of the conductive inner lead 202B. A piece of copper 200F is left from the sheet 203, and is inserted into a bottom portion of the recess 200E as shown in FIG. 33B. The punch unit 214 is then moved upwardly, and the conductive inner lead 200B with the bump 200D is left on the female die unit 215. The bump 200D thus formed have an irregularity ranging between −1 micron and +1 micron in height.

Figure 34:
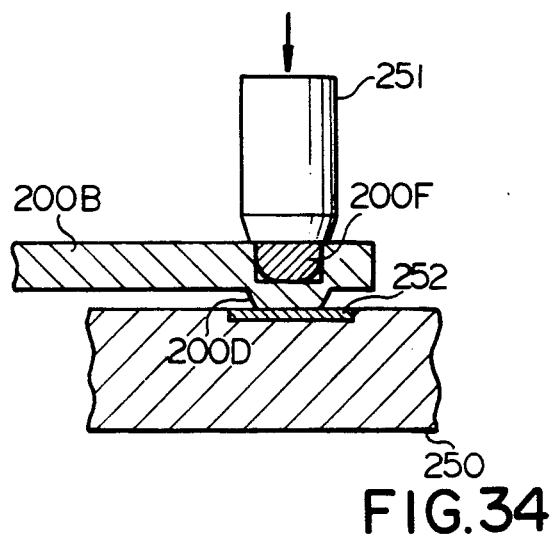
FIG. 34 is a cross sectional view showing a conductive inner lead of the film carrier shown in FIG. 31 assembled with a semiconductor chip.

The film carrier 200 is assembled with a semiconductor chip 250 through a thermocompression bonding process as shown in FIG. 34, and the semiconductor chip 250 and a pressing tool 251 are respectively heated to about 275 degrees and about 450 degrees in centigrade. The pressing tool 251 presses the bump 200D against an aluminum pad 252 of the semiconductor chip 250 at about 60 gf/lead for a second. The bump 200D is bonded to the aluminum pad 252, and the connection between the bump 200D and the aluminum pad 252 achieves a large bonding strength and good electrical properties even though the irregularity between −1 micron and +1 micron takes place. In fact, even though the conductive inner lead 200B is subjected to a pulling force as large as 60 gf, no disconnection takes place and good electrical properties are achieved. Moreover, the bumps 200B are not decreased in height under 20 microns. This is because of the fact that the tool 251 partially deforms the bump 200D at the initial stage of the thermocompression bonding process but the piece of copper 200F allows the bump 200D to behave as being a rigid body after the tool 251 is brought in to contact with the piece of copper 200F. Then, a manufacturer can increases the amount of the bonding force without crashing the bump 200D, and such a large bonding force enhances the adhesion between the bump 200D and the pad 252.

For evaluation of a stability or reliability, the conductive inner lead 200B is subjected to a heat cycle between +120 degrees and −40 degrees in centigrade per an hour, and the heat cycle is repeated five hundred times. However, no inferior connection takes place in the connection between the bump 200D and the pad 252.

Although particular embodiments of the present invention have been shown and described, it will be obvious to those skilled in the art that various changes and modifications may be made without departing from the spirit and scope of the present invention. In the embodiments described hereinbefore, the bumps are formed on the reverse side surface of the conductive inner lead, however, a bump may be formed on the front side of a conductive lead.

What is claimed is:

1. A process of forming a bump in a conductive lead of a film carrier, said process comprising the steps of:

a) preparing said film carrier, a pressing machine and a drawing die unit having a female die and a male die, said drawing die unit being installed in said pressing machine, said female die have a recess which has a width that is smaller than a width of said conductive lead, said male die having a protrusion which is movable into the recess formed in said female die, b) placing said film carrier on said female die in such a manner that said conductive lead covers the recess formed in the female die,
c) aligning said male die with said female die in such a manner that said protrusion is movable into said recess, and
d) causing said pressing machine to press one of said female and male dies toward the other of said female and male dies so that said conductive lead is deformed to have a bump having a projecting surface projecting from a reverse side surface of said conductive lead and a depressed surface defining a recess open to a front side surface of said conductive lead, in which said process further comprises the step of providing a sheet of metal over said conductive lead between said steps b) and c), and in which a piece of said metal is inserted into a bottom portion of said recess upon deforming said conductive lead, said metal having a melting point which is higher than a temperature applied in a thermocompression bonding stage carried out after said step d).

2. A drawing apparatus for forming a bump in a conductive lead of a film carrier, said apparatus comprising
a) a frame,
b) a female die which is stationary with respect to said frame and having a recess which is covered with the conductive lead of said film carrier,
c) a male die which is movable with respect to said frame and which has a protrusion that is movable into the recess formed in said female die, and
d) a driving mechanism for causing said male die to move toward said female die and allowing said protrusion to deform said conductive lead for forming a bump having a projecting surface projecting from a reverse side surface of the conductive lead and a depressed surface defining a recess that is open to a front side surface of the conductive lead, in which said drawing apparatus further comprises a retainer unit which is stationary with respect to said female die and which retains a sheet of metal which is to be located between said conductive lead and said protrusion before said protrusion is moved toward said female die, a piece of metal from said sheet of metal being left in said recess after formation of said bump.

* * * * *